US011799443B2

(12) United States Patent
Omura et al.

(10) Patent No.: US 11,799,443 B2
(45) Date of Patent: Oct. 24, 2023

(54) ACOUSTIC WAVE DEVICE

(71) Applicant: Murata Manufacturing Co., Ltd., Nagaokakyo (JP)

(72) Inventors: Masashi Omura, Nagaokakyo (JP); Tetsuya Kimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 370 days.

(21) Appl. No.: 17/338,762

(22) Filed: Jun. 4, 2021

(65) Prior Publication Data
US 2021/0297060 A1 Sep. 23, 2021

Related U.S. Application Data

(63) Continuation of application No. PCT/JP2019/047470, filed on Dec. 4, 2019.

(30) Foreign Application Priority Data

Dec. 6, 2018 (JP) .................. 2018-229429

(51) Int. Cl.
*H03H 9/145* (2006.01)
*H03H 9/02* (2006.01)
(Continued)

(52) U.S. Cl.
CPC ........ *H03H 9/145* (2013.01); *H03H 9/02535* (2013.01); *H03H 9/25* (2013.01); *H03H 9/64* (2013.01)

(58) Field of Classification Search
CPC ...... H03H 9/145; H03H 9/02535; H03H 9/25; H03H 9/64
See application file for complete search history.

(56) References Cited

U.S. PATENT DOCUMENTS 9,970,993 B1\* 5/2018 Mensah-Brown ...... B60L 50/16
10,381,998 B2\* 8/2019 Inoue .................. H03H 9/02952
(Continued)

FOREIGN PATENT DOCUMENTS

| WO | 2012/086441 A1 | 6/2012 |
| WO | 2016/147986 A1 | 9/2016 |
| WO | 2017/077892 A1 | 5/2017 |

OTHER PUBLICATIONS

Official Communication issued in International Patent Application No. PCT/JP2019/047470, dated Feb. 18, 2020.

*Primary Examiner* — Adam D Houston
(74) *Attorney, Agent, or Firm* — KEATING & BENNETT, LLP

(57) ABSTRACT

An acoustic wave device includes a supporting substrate, an acoustic reflection layer, a piezoelectric layer, and an IDT electrode. At least one of a high acoustic impedance layer and a low acoustic impedance layer is a conductive layer in the acoustic reflection layer. When a wavelength of an acoustic wave determined by an electrode finger pitch of the IDT electrode is λ and a region between an envelope of tips of first electrode fingers and an envelope of tips of second electrode fingers is an intersecting region, the conductive layer overlaps at least the intersecting region in plan view in a thickness direction of the supporting substrate, and a distance from the tips of the first electrode fingers to an end of the conductive layer in a direction in which the first electrode fingers extend is more than 0 and not more than about 12λ.

19 Claims, 6 Drawing Sheets

(51) Int. Cl.
*H03H 9/25* (2006.01)
*H03H 9/64* (2006.01)

(56) References Cited

U.S. PATENT DOCUMENTS

| | | | |
|---|---|---|---|
| 11,206,007 B2* | 12/2021 | Inoue | H03H 9/02559 |
| 2005/0077982 A1* | 4/2005 | Funasaka | H03H 9/02574 |
| | | | 333/195 |
| 2014/0152146 A1 | 6/2014 | Kimura et al. | |
| 2017/0288629 A1* | 10/2017 | Bhattacharjee | H03H 9/02275 |
| 2017/0366163 A1 | 12/2017 | Kishimoto | |
| 2018/0109242 A1* | 4/2018 | Solal | H03H 9/02866 |
| 2020/0212889 A1* | 7/2020 | Omura | H03H 9/02866 |
| 2020/0220518 A1* | 7/2020 | Omura | H03H 9/132 |
| 2021/0119606 A1* | 4/2021 | Lu | H03H 9/02842 |
| 2021/0297060 A1* | 9/2021 | Omura | H03H 9/02102 |
| 2022/0014172 A1* | 1/2022 | Nozoe | H03H 9/02062 |
| 2022/0069803 A1* | 3/2022 | Nozoe | H03H 9/02574 |
| 2022/0216844 A1* | 7/2022 | Yamane | H03H 9/564 |
| 2022/0216845 A1* | 7/2022 | Yamane | H03H 9/02015 |
| 2022/0216846 A1* | 7/2022 | Yamane | H03H 9/02031 |
| 2022/0216848 A1* | 7/2022 | Kimura | H03H 9/13 |
| 2022/0216854 A1* | 7/2022 | Yamane | H03H 9/02102 |
| 2022/0224305 A1* | 7/2022 | Kimura | H03H 9/175 |
| 2022/0239280 A1* | 7/2022 | Kawano | H03H 9/25 |
| 2022/0321096 A1* | 10/2022 | Goto | H03H 9/08 |
| 2022/0345108 A1* | 10/2022 | Nagatomo | H03H 9/25 |
| 2022/0368305 A1* | 11/2022 | Iwamoto | H03H 9/02559 |
| 2023/0027129 A1* | 1/2023 | Caron | H03H 9/6406 |
| 2023/0108686 A1* | 4/2023 | Fukuhara | H03H 9/145 |
| | | | 310/365 |
| 2023/0113099 A1* | 4/2023 | Goto | H10N 30/50 |
| | | | 455/73 |
| 2023/0179171 A1* | 6/2023 | Yasuda | H03H 9/0552 |
| | | | 333/193 |

\* cited by examiner

ACOUSTIC WAVE DEVICE

CROSS REFERENCE TO RELATED APPLICATIONS

This application claims the benefit of priority to Japanese Patent Application No. 2018-229429 filed on Dec. 6, 2018 and is a Continuation Application of PCT Application No. PCT/JP2019/047470 filed on Dec. 4, 2019. The entire contents of each application are hereby incorporated herein by reference.

BACKGROUND OF THE INVENTION

1. Field of the Invention

The present invention relates to an acoustic wave device and, more specifically, to an acoustic wave device including a piezoelectric layer.

2. Description of the Related Art

Conventionally, an acoustic wave device including a supporting substrate, an acoustic reflection layer, a piezoelectric layer, and an interdigital transducer (IDT) electrode is known (see, for example, International Publication No. 2012/086441).

The acoustic reflection layer is formed on the supporting substrate. The piezoelectric layer is formed on the acoustic reflection layer. The IDT electrode is formed on the upper surface of the piezoelectric layer.

The acoustic reflection layer has a low acoustic impedance layer and a high acoustic impedance layer having an acoustic impedance higher than that of the low acoustic impedance layer.

International Publication No. 2012/086441 discloses the combination of tungsten (W) and silicon oxide ($SiO_2$) as a combination of materials that maximizes the acoustic impedance ratio, which is the ratio between the acoustic impedance of the high acoustic impedance layer and the acoustic impedance of the low acoustic impedance layer.

In the acoustic wave device disclosed in International Publication No. 2012/086441, when, for example, the acoustic reflection layer includes a conductive layer (a high acoustic impedance layer) made of tungsten, there is a problem in that the parasitic capacitance generated between the IDT electrode and the conductive layer reduces resonance characteristics.

SUMMARY OF THE INVENTION

Preferred embodiments of the present invention provide acoustic wave devices that are each capable of improving resonance characteristics. The improvement of resonance characteristics means the improvement of the impedance ratio and the Q value of resonance characteristics by reducing propagation loss.

An acoustic wave device according to a preferred embodiment of the present invention includes a supporting substrate, an acoustic reflection layer, a piezoelectric layer, and an IDT electrode. The acoustic reflection layer is provided on the supporting substrate. The piezoelectric layer is provided on the acoustic reflection layer. The IDT electrode is provided on the piezoelectric layer. The acoustic reflection layer includes at least one high acoustic impedance layer and at least one low acoustic impedance layer. The at least one low acoustic impedance layer has an acoustic impedance lower than that of the at least one high acoustic impedance layer. At least one of the at least one high acoustic impedance layer and the at least one low acoustic impedance layer is a conductive layer in the acoustic reflection layer. The IDT electrode includes a first busbar, a second busbar, a plurality of first electrode fingers, and a plurality of second electrode fingers. The second busbar faces the first busbar. The plurality of first electrode fingers are connected to the first busbar and extend toward the second busbar. The plurality of second electrode fingers are connected to the second busbar and extend toward the first busbar. When a wavelength of an acoustic wave determined by an electrode finger pitch of the IDT electrode is λ and a region between an envelope of tips of the plurality of first electrode fingers and an envelope of tips of the plurality of second electrode fingers is an intersecting region, the conductive layer overlaps at least the intersecting region in plan view in a thickness direction of the supporting substrate and a distance from the tips of the plurality of first electrode fingers to an end of the conductive layer in a direction in which the plurality of first electrode fingers extend is more than 0 and not more than about 12λ.

The acoustic wave devices according to preferred embodiments of the present invention are each able to improve resonance characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
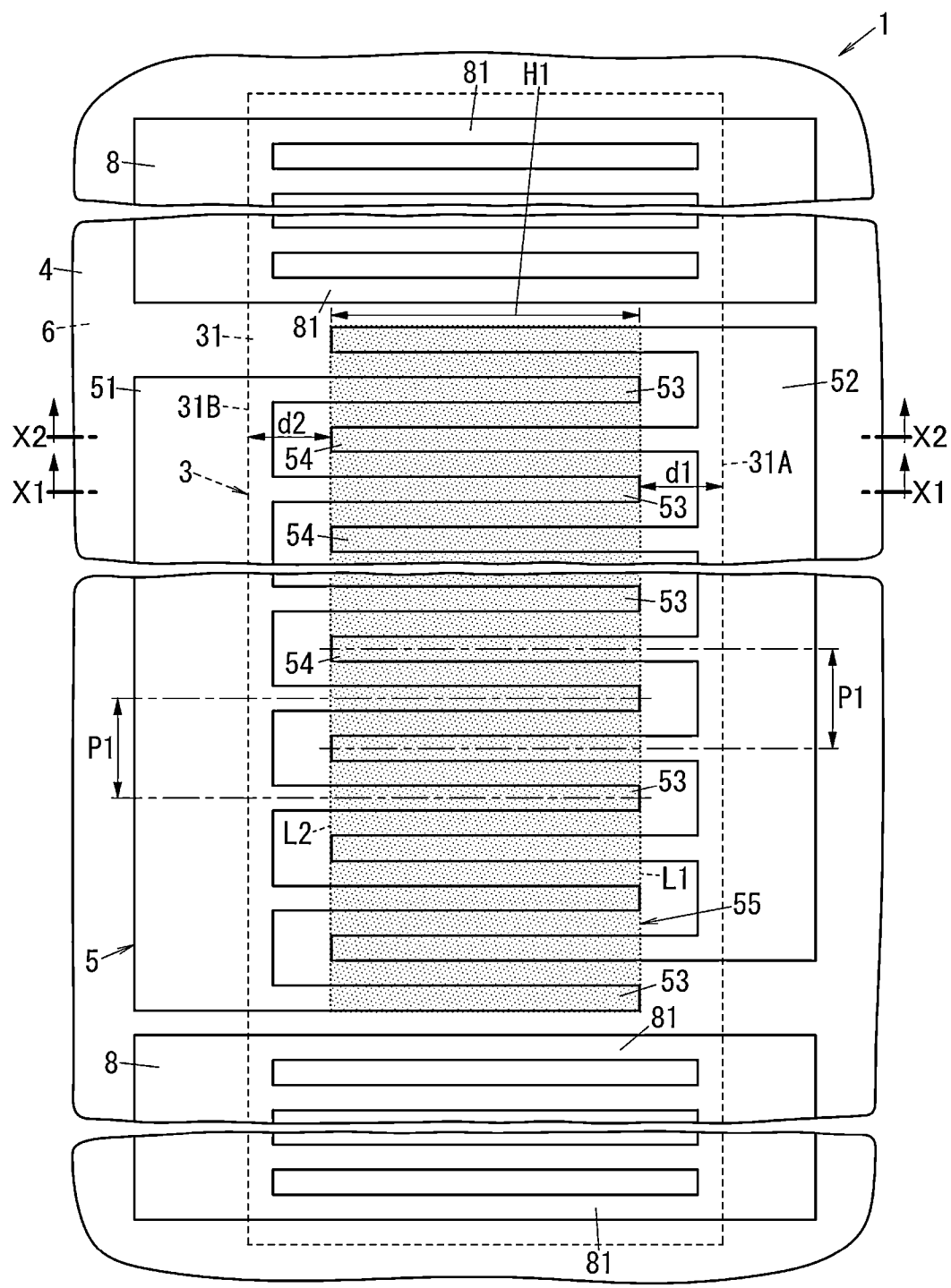
FIG. 1 is a plan view of an acoustic wave device according to a preferred embodiment of the present invention.

Acoustic wave devices according to preferred embodiments will be described below with reference to the drawings.

FIGS. 1 to 3 and FIG. 7 are schematic views and the ratios of the sizes and the thicknesses of individual components in the drawings do not necessarily reflect the actual dimensional ratios.

(1) Overall Structure of the Acoustic Wave Device

An acoustic wave device 1 according to a preferred embodiment of the present invention will be described below with reference to FIGS. 1 to 3.

The acoustic wave device 1 according to the present preferred embodiment is an acoustic wave device that uses, for example, a plate wave as an acoustic wave. The acoustic wave device 1 includes a supporting substrate 2, an acoustic reflection layer 3, a piezoelectric layer 4, and an IDT electrode 5. The acoustic reflection layer 3 is provided on the supporting substrate 2. The piezoelectric layer 4 is provided on the acoustic reflection layer 3. The IDT electrode 5 is provided on the piezoelectric layer 4. The acoustic reflection layer 3 includes at least one (for example, two) high acoustic impedance layer 31 and at least one (for example, three) low acoustic impedance layer 32. The low acoustic impedance layer 32 has an acoustic impedance lower than that of the high acoustic impedance layer 31. In addition, the acoustic wave device 1 further includes an electrical insulating layer 6. The electrical insulating layer 6 is provided on the supporting substrate 2 and surrounds the acoustic reflection layer 3. In the acoustic wave device 1, an intermediate layer 7 including the acoustic reflection layer 3 and the electrical insulating layer 6 is interposed between the supporting substrate 2 and the piezoelectric layer 4. The acoustic wave device 1 further includes two reflectors 8. The two reflectors 8 are respectively located on opposite sides of the IDT electrode 5 in a direction along the propagation direction of the acoustic wave of the acoustic wave device 1.

(2) Components of the Acoustic Wave Device

Next, the components of the acoustic wave device 1 will be described with reference to the drawings.

(2.1) Supporting Substrate

Figure 2:
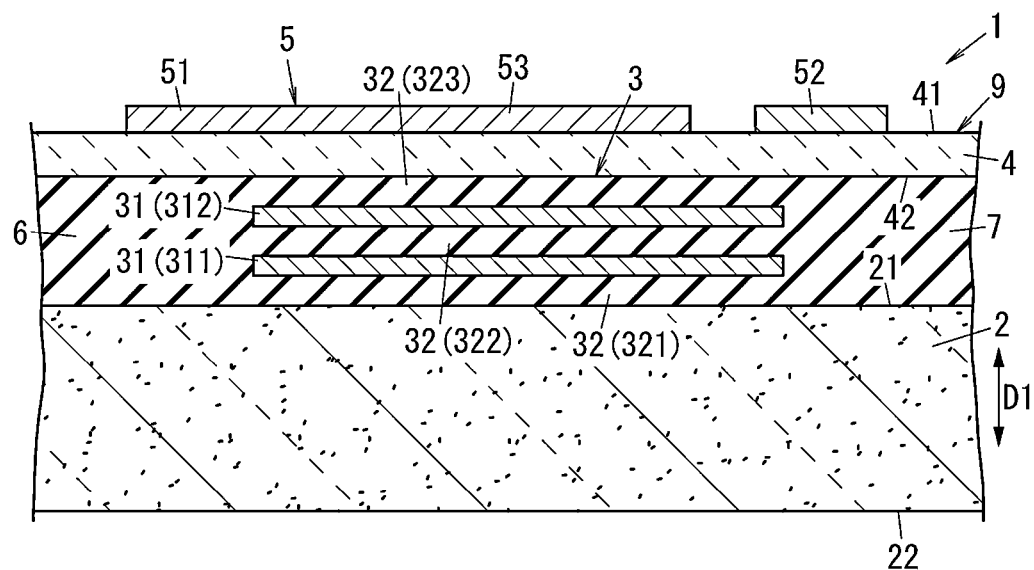
FIG. 2 is a sectional view of the acoustic wave device described above taken along line X1-X1 in FIG. 1.
Figure 3:
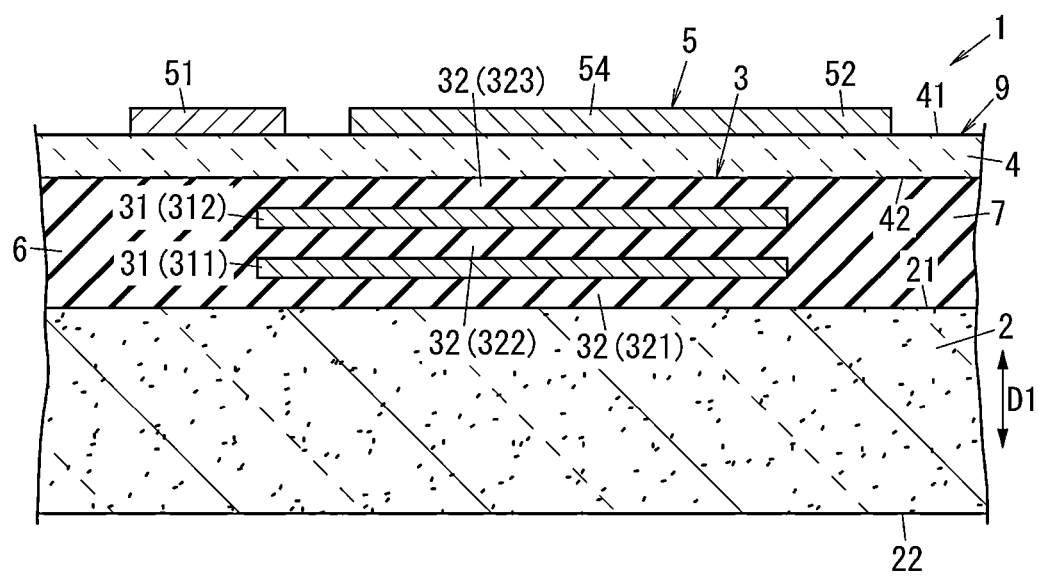
FIG. 3 is a sectional view of the acoustic wave device described above taken along line X2-X2 in FIG. 1.

As illustrated in FIG. 2, the supporting substrate 2 supports a multilayer body 9 including the acoustic reflection layer 3, the piezoelectric layer 4, and the IDT electrode 5. The multilayer body 9 also includes the electrical insulating layer 6.

The supporting substrate 2 includes a first main surface 21 and a second main surface 22. The first main surface 21 and the second main surface 22 face each other. Although the shape of the supporting substrate 2 in plan view (the outer peripheral shape of the supporting substrate 2 when viewed in a thickness direction D1) is rectangular or substantially rectangular, the shape is not limited to this and may be, for example, square.

The supporting substrate 2 is, for example, a silicon substrate. The thickness of the supporting substrate 2 is preferably not less than about 10λ (λ: wavelength of an acoustic wave determined by an electrode finger pitch P1) μm and not more than about 180 μm and is, for example, about 120 μm. When the supporting substrate 2 is a silicon substrate, the plane orientation of the first main surface 21 can be, for example, the (100) plane, the (111) plane, or the (551) plane. The propagation orientation of an acoustic wave can be set without being restricted by the plane orientation of the silicon substrate.

The material for the supporting substrate 2 is not limited to silicon (Si), and may be, for example, lithium niobate (LiNbO$_3$), lithium tantalate (LiTaO$_3$), quartz, or glass.

(2.2) Acoustic Reflection Layer

As illustrated in FIG. 2, the acoustic reflection layer 3 is provided on the first main surface 21 of the supporting substrate 2. The acoustic reflection layer 3 faces the IDT electrode 5 in the thickness direction D1 of the supporting substrate 2.

The acoustic reflection layer 3 reduces or prevents the leakage of an acoustic wave excited by the IDT electrode 5 to the supporting substrate 2. The acoustic wave device 1 includes the acoustic reflection layer 3 to improve the effect of confining acoustic wave energy within the piezoelectric layer 4 and the IDT electrode 5 that excites the acoustic wave. Accordingly, the acoustic wave device 1 can reduce loss and increase the Q value as compared with the case in which the acoustic reflection layer 3 is not provided.

The acoustic reflection layer 3 has a multilayer structure including the plurality of (for example, three) low acoustic impedance layers 32 and the plurality of (for example, two) high acoustic impedance layers 31 are arranged alternately one by one in the thickness direction D1 of the supporting substrate 2. The acoustic impedance of the low acoustic impedance layer 32 is lower than the acoustic impedance of the high acoustic impedance layer 31.

In the following description, for convenience of explanation, the two high acoustic impedance layers 31 of the acoustic reflection layer 3 may be referred to as a first high acoustic impedance layer 311 and a second high acoustic impedance layer 312 in the order closer to the first main surface 21 of the supporting substrate 2. In addition, the three low acoustic impedance layers 32 may be referred to as a first low acoustic impedance layer 321, a second low acoustic impedance layer 322, and a third low acoustic impedance layer 323 in the order closer to the first main surface 21 of the supporting substrate 2.

In the acoustic reflection layer 3, the first low acoustic impedance layer 321, the first high acoustic impedance layer 311, the second low acoustic impedance layer 322, the second high acoustic impedance layer 312, and the third low acoustic impedance layer 323 are provided in this order from the side of the supporting substrate 2. Accordingly, the acoustic reflection layer 3 can reflect the acoustic wave (the plate wave) from the piezoelectric layer 4 via the interface between the third low acoustic impedance layer 323 and the second high acoustic impedance layer 312, the interface between the second high acoustic impedance layer 312 and the second low acoustic impedance layer 322, the interface between the second low acoustic impedance layer 322 and the first high acoustic impedance layer 311, and the interface between the first high acoustic impedance layer 311 and the first low acoustic impedance layer 321.

The material of the plurality of high acoustic impedance layers 31 is, for example, platinum (Pt). In addition, the material of the plurality of low acoustic impedance layers 32 is, for example, silicon oxide (SiO$_2$). The thickness of each of the plurality of high acoustic impedance layers 31 is preferably, for example, about 0.09λ. In addition, the thickness of each of the plurality of low acoustic impedance layers 32 is preferably, for example, about 0.14λ. The acoustic reflection layer 3 includes two conductive layers because the two high acoustic impedance layers 31 are made of, for example, Pt.

The material for the plurality of high acoustic impedance layers 31 is not limited to platinum (Pt), and may be, for example, a metal such as tungsten (W) or tantalum (Ta). In addition, in the acoustic reflection layer 3, the high acoustic impedance layers 31 do not need to be the conductive layers and the low acoustic impedance layers 32 may be the conductive layers.

In addition, the materials of the plurality of high acoustic impedance layers 31 do not need to be the same material and may be different materials, for example. In addition, the plurality of low acoustic impedance layers 32 do not need to be the same material and may be different materials, for example.

In addition, the number of the high acoustic impedance layers 31 and the number of the low acoustic impedance layers 32 in the acoustic reflection layer 3 are not limited to two and three, respectively, and may be, for example, not less than 2 and not less than 3, respectively. In addition, the number of the high acoustic impedance layers 31 and the number of the low acoustic impedance layers 32 do not need to be different from each other and may be the same as each other, and the number of the low acoustic impedance layers 32 may be one smaller than the number of the high acoustic impedance layers 31. In addition, in the acoustic reflection layer 3, at least one of the high acoustic impedance layers 31 only needs to overlap at least one of the low acoustic impedance layers 32 in the thickness direction D1 of the supporting substrate 2.

(2.3) Electrical Insulating Layer

The electrical insulating layer 6 has electrical insulation. The electrical insulating layer 6 surrounds the acoustic reflection layer 3 in plan view in the thickness direction D1 of the supporting substrate 2. The electrical insulating layer 6 is interposed between the supporting substrate 2 and the piezoelectric layer 4 at a position different from that of the acoustic reflection layer 3. The electrical insulating layer 6 is a region (a portion) other than the acoustic reflection layer 3 in the intermediate layer 7 interposed between the supporting substrate 2 and the piezoelectric layer 4. The electrical insulating layer 6 is preferably made of the same material as, for example, the low acoustic impedance layer 32. The material for the electrical insulating layer 6 is, for example, silicon oxide ($SiO_2$).

(2.4) Piezoelectric Layer

The piezoelectric layer 4 includes a first main surface 41 and a second main surface 42. The first main surface 41 and the second main surface 42 face each other. Of the Euler angles ($\varphi, \theta, \psi$) of the piezoelectric layer 4, $\psi$ corresponding to the propagation orientation of the acoustic wave excited by the IDT electrode 5 can be, for example, not less than about 0° and not more than about 90°. The piezoelectric layer 4 includes, for example, X-cut 40° propagation $LiNbO_3$ with Euler angles of (about 90°, about 90°, about 40°). The material for the piezoelectric layer 4 is not limited to $LiNbO_3$ and may be, for example, $LiTaO_3$.

The thickness of the piezoelectric layer 4 is preferably not more than, for example, about 1λ where λ is the wavelength of the acoustic wave determined by the electrode finger pitch P1 of the IDT electrode 5. Accordingly, in the acoustic wave device 1, the plate wave is excited by the IDT electrode 5 and the plate wave is propagated. The thickness of the piezoelectric layer 4 is preferably, for example, about 0.2λ. The electrode finger pitch P1 will be described in the section "(2.5) IDT electrode" below.

(2.5) IDT Electrode

The IDT electrode 5 is provided on the piezoelectric layer 4. More specifically, the IDT electrode 5 is provided on the first main surface 41 opposite to the second main surface 42 of the piezoelectric layer 4 on the side of the intermediate layer 7.

The IDT electrode 5 includes a first busbar 51, a second busbar 52, a plurality of first electrode fingers 53, and a plurality of second electrode fingers 54. The second busbar 52 faces the first busbar 51.

The plurality of first electrode fingers 53 are connected to the first busbar 51 and extend toward the second busbar 52. The plurality of first electrode fingers 53 are formed integrally with the first busbar 51 and are separated from the second busbar 52. The gap length between the tips of the plurality of first electrode fingers 53 and the second busbar 52 is, for example, about 0.2λ.

The plurality of second electrode fingers 54 are connected to the second busbar 52 and extend toward the first busbar 51. The plurality of second electrode fingers 54 are formed integrally with the second busbar 52 and are separated from the first busbar 51. The gap length between the tips of the plurality of second electrode fingers 54 and the first busbar 51 is, for example, about 0.2λ.

In the IDT electrode 5, the plurality of first electrode fingers 53 and the plurality of second electrode fingers 54 are alternately disposed one by one at a distance from each other. Accordingly, the first electrode finger 53 and the second electrode finger 54 that are adjacent to each other are separated from each other. The first busbar 51 is a conductor portion that keeps the plurality of first electrode fingers 53 at the same electric potential. The second busbar 52 is a conductor portion that keeps the plurality of second electrode fingers 54 at the same electric potential (the equal potential).

As illustrated in FIG. 1, the electrode finger pitch P1 of the IDT electrode 5 is defined as the distance between the center lines of two adjacent first electrode fingers 53 among the plurality of first electrode fingers 53 or the distance between the center lines of two adjacent second electrode fingers 54 among the plurality of second electrode fingers 54. The distance between the center lines of two adjacent second electrode fingers 54 is the same or substantially the same as the distance between the center lines of two adjacent first electrode fingers 53.

In the IDT electrode 5 of the acoustic wave device 1 according to the present preferred embodiment, the number of pairs of the first electrode finger 53 and the second electrode finger 54 is, for example, 100. That is, the IDT electrode 5 includes, for example, 100 first electrode fingers 53 and 100 second electrode fingers 54.

The IDT electrode 5 is conductive. The material for the IDT electrode 5 is, for example, aluminum (Al), copper (Cu), platinum (Pt), gold (Au), silver (Ag), titanium (Ti), nickel (Ni), chromium (Cr), molybdenum (Mo), tungsten (W), alloy mainly including any one of these metals, or the like. In addition, the IDT electrode 5 may have a structure in which a plurality of metal films made of any of these metals or alloy thereof are laminated. The IDT electrode 5 includes a multilayer film including, for example, an adhesion film including a Ti film provided on the piezoelectric layer 4 and a main electrode film including an Al film provided on the adhesion film. The thickness of the adhesion film is, for example, about 10 nm. In addition, the thickness of the main electrode film is, for example, about 80 nm. It should be noted that the IDT electrode 5 may include a metal film provided on the main electrode film in the first busbar 51 and the second busbar 52 from the viewpoint of, for example, reducing the resistance of the first busbar 51 and the second busbar 52.

The IDT electrode 5 includes an intersecting region 55 including the plurality of first electrode fingers 53 and the plurality of second electrode fingers 54. The intersecting region 55 is between an envelope L1 of the tips of the plurality of first electrode fingers 53 and an envelope L2 of the tips of the plurality of second electrode fingers 54. The IDT electrode 5 excites the acoustic wave (the plate wave) in the intersecting region 55. In FIG. 1, dot hatching is provided for the intersecting region 55 of the IDT electrode 5, but this hatching does not represent a cross section and only makes the relative positional relationship between the intersecting region 55 and the first and second busbars 51 and 52 easier to understand.

In the IDT electrode 5, an intersecting width H1 of the intersecting region 55 is the width of the intersecting region 55 in the direction in which the plurality of first electrode fingers 53 extend.

The IDT electrode 5 may be a normal IDT electrode, an IDT electrode including apodized weighting, or a tilted IDT electrode, for example. For the IDT electrode including apodized weighting, the intersecting width increases toward the center from one end portion in the propagation direction of the acoustic wave and the intersecting width reduces toward the other end portion from the center in the propagation direction of the acoustic wave. Accordingly, when the IDT electrode 5 includes apodized weighting, the intersecting region 55 of the IDT electrode 5 is rhombic or hexagonal, for example. In the IDT electrode including apodized weighting, the angles (apodizing angles) provided by the envelope L1 of the tips of the plurality of first electrode fingers 53 and the envelope L2 of the tips of the plurality of second electrode fingers 54 and the propagation direction of the acoustic wave are more than about 0°.

(2.6) Reflector

The two reflectors 8 are short-circuit gratings. The reflectors 8 reflect the acoustic wave.

Each of the reflectors 8 includes a plurality of electrode fingers 81, and one ends of the plurality of electrode fingers 81 are short-circuited to each other and the other ends thereof are short-circuited to each other. In each of the reflectors 8, the number of electrode fingers 81 is, for example, 20.

The reflectors 8 are conductive. The material for the reflectors 8 is, for example, Al, Cu, Pt, Au, Ag, Ti, Ni, Cr, Mo, W, alloy mainly including any one of these metals, or the like. In addition, the reflectors 8 may have a structure in which a plurality of metal films made of any of these metals or alloys thereof are laminated. Each of the reflectors 8 includes a multilayer film including, for example, an adhesion film including a Ti film provided on the piezoelectric layer 4 and a main electrode film including an Al film provided on the adhesion film. The thickness of the adhesion film is, for example, about 10 nm. In addition, the thickness of the main electrode film is, for example, about 80 nm.

In the acoustic wave device 1, when the reflectors 8 and the IDT electrode 5 are made of the same material and have the same or substantially the same thickness, the reflectors 8 and the IDT electrode 5 can be formed in the same process when the acoustic wave device 1 is manufactured.

In the acoustic wave device 1, the reflectors 8 overlap the acoustic reflection layer 3 in plan view in the thickness direction D1 of the supporting substrate 2.

(3) Layout

In the acoustic wave device 1, the conductive layer (the high acoustic impedance layer 31) overlaps at least the intersecting region 55 in plan view in the thickness direction D1 of the supporting substrate 2. In addition, in the acoustic wave device 1, a distance d1 from the tips of the plurality of first electrode fingers 53 to the end of the conductive layer (the high acoustic impedance layer 31) in the direction in which the plurality of first electrode fingers 53 extend is more than 0 and not more than about 12λ, for example. In addition, in the acoustic wave device 1, a distance d2 from the tips of the plurality of second electrode fingers 54 to the end of the conductive layer (the high acoustic impedance layer 31) in the direction in which the plurality of second electrode fingers 54 extend is more than 0 and not more than about 12λ, for example. Although the distance d1 and the distance d2 are the same or substantially the same in the acoustic wave device 1, the distance d1 and the distance d2 may be different from each other.

(4) Characteristics of the Acoustic Wave Device

Figure 4:
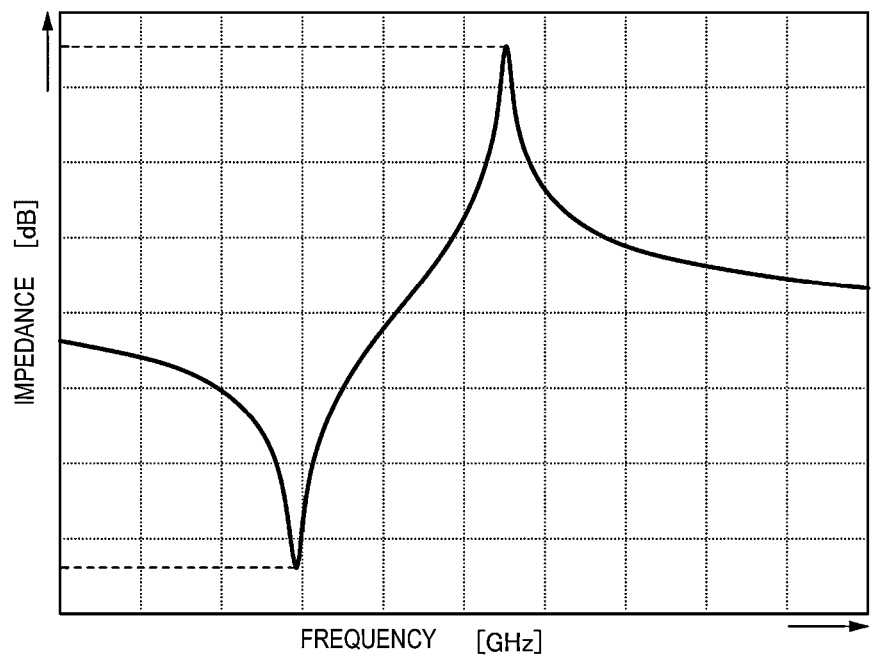
FIG. 4 is an explanatory diagram illustrating the impedance versus the frequency characteristics of the acoustic wave device in FIG. 1.

FIG. 4 illustrates the frequency characteristics of the impedance of the acoustic wave device 1. In FIG. 4, the horizontal axis represents the frequency and the vertical axis represents the impedance [dB] of the acoustic wave device 1. The impedance [dB] here is the value obtained by $20 \times \log_{10}|Z|$ where Z is the impedance of the acoustic wave device 1.

The impedance ratio of the acoustic wave device 1 is the value obtained by impedance ratio=$(20 \times \log_{10}|Z2|)-(20 \times \log_{10}|Z1|)$, where Z1 represents the impedance of the acoustic wave device 1 at the resonant frequency and Z2 is the impedance of the acoustic wave device 1 at the anti-resonant frequency.

Figure 5:
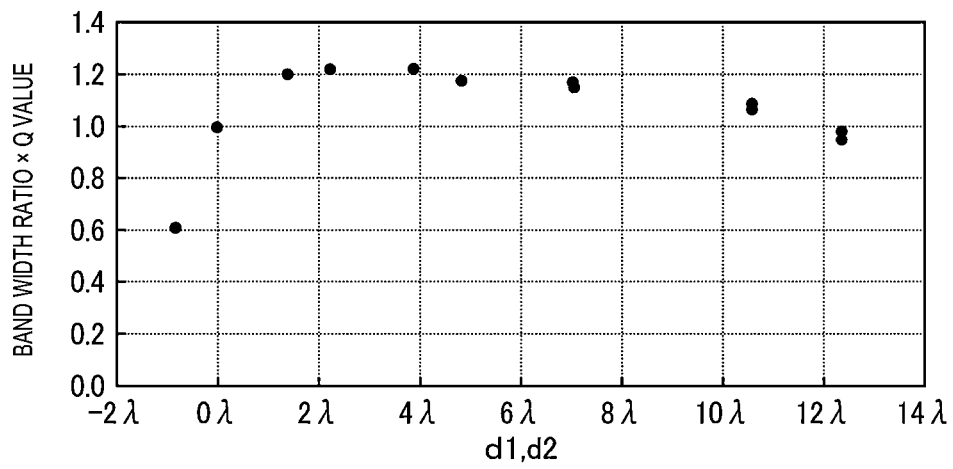
FIG. 5 is a graph illustrating the relationship between the distance between tips of first electrode fingers of an IDT electrode and an end of a conductive layer and the bandwidth ratio multiplied by a Q value.

FIG. 5 illustrates the relationship between the distances d1 and d2 and "bandwidth ratio×Q value" in the acoustic wave device 1 according to the present preferred embodiment, using the resonance characteristics of the acoustic wave device 1 as an example of an evaluation item. Here, the bandwidth ratio is defined by bandwidth ratio=(resonant frequency−anti-resonant frequency)/resonant frequency.

The horizontal axis in FIG. 5 represents "distance d1 and distance d2". In FIG. 5, the distances d1 and d2 are 0 when the ends (ends 31A and 31B of the high acoustic impedance layer 31) of the conductive layer (the high acoustic impedance layer 31) match the tips of the first electrode fingers 53 and the tips of the second electrode fingers 54, the distances d1 and d2 are positive when the ends (the ends 31A and 31B of the high acoustic impedance layer 31) of the conductive layer are located in the outer side portion of the tips of the first electrode fingers 53 and the tips of the second electrode fingers 54, and the distances d1 and d2 are negative when the ends (the ends 31A and 31B of the high acoustic impedance layer 31) of the conductive layer are located in the inner side portion of the tips of the first electrode fingers 53 and the tips of the second electrode fingers 54. "Bandwidth ratio×Q value" on the vertical axis in FIG. 5 is the value standardized by the value obtained by the bandwidth ratio×the Q value when the distance d1 and the distance d2 are 0. It should be noted that the acoustic wave device generally has a larger impedance ratio for a wider bandwidth ratio when the Q value is the same or substantially the same.

FIG. 5 illustrates the plots of the values standardized by "bandwidth ratio×Q value" when the distance d1 and the distance d2 are about 0λ, about 1.4λ, about 2.2λ, about 3.9λ, about 4.8λ, about 7λ, about 10.6λ, and about 12.4λ. For comparison with the acoustic wave device 1 according to the present preferred embodiment, FIG. 5 also illustrates the plots of the values standardized by "bandwidth ratio×Q value" when the distance d1 and the distance d2 are about −0.8λ and when the distance d1 and the distance d2 are about 12.4λ. It should be noted that the structural parameters of the sample for which characteristics evaluation has been made to obtain the evaluation results in FIG. 5 are shown below.

Piezoelectric layer 4: X-cut 40° propagation LiNbO$_3$ with Euler angles of (about 90°, about 90°, about 40°)

Thickness of piezoelectric layer 4: about 0.2λ

Material for high acoustic impedance layer 31: Pt

Thickness of high acoustic impedance layer 31: about 0.09λ

Material for acoustic impedance layer 32: SiO$_2$

Thickness of low acoustic impedance layer 32: about 0.14λ,

IDT electrode 5: IDT electrode with apodized weighting

Number of pairs of first electrode finger 53 and second electrode finger 54: 100 pairs Intersecting width H1 (average intersecting width) of intersecting region 55: about 15λ

Number of electrode fingers in reflector 8: 20

Gap length between the tips of the plurality of first electrode fingers 53 and the second busbar 52: about 0.2λ

Gap length between the tips of the plurality of second electrode fingers 54 and the first busbar 51: about 0.2λ

It can be seen from the results in FIG. 5 that, in the acoustic wave device 1, when the tips of the plurality of first electrode fingers 53 and the tips of the plurality of second electrode fingers 54 overlap the high acoustic impedance layer 31 in plan view seen in the thickness direction of the supporting substrate 2 by setting the distance d1 and the distance d2 larger than 0λ and not more than about 12λ, the resonance characteristics can be improved as compared with the case in which the distance d1 and the distance d2 are set to 0λ. In the acoustic wave device 1 according to the present preferred embodiment, the resonance characteristics can be improved as compared with the case in which the conductive layer overlaps the entire IDT electrode 5 in plan view seen in the thickness direction D1 of the supporting substrate 2.

In addition, in the acoustic wave device 1, the gap length between the tips of the plurality of first electrode fingers 53 and the second busbar 52 is, for example, about 0.2λ and the gap length between the tips of the plurality of second electrode fingers 54 and the first busbar 51 is, for example, about 0.2λ in plan view seen in the thickness direction D1 of the supporting substrate 2. Accordingly, in the acoustic wave device 1, when the distance d1 and the distance d2 are more than about 0.2λ and not more than about 12λ, the conductive layer (the high acoustic impedance layer 31) overlaps both a portion of the first busbar 51 and a portion of the second busbar 52.

Figure 6:
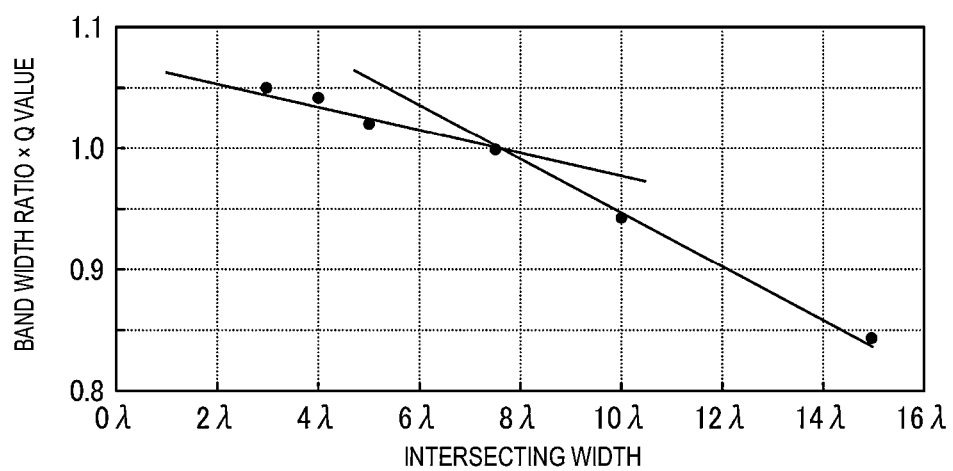
FIG. 6 is a graph illustrating the relationship between the intersecting width of an intersecting region of the IDT electrode and the bandwidth ratio multiplied by the Q value.

FIG. 6 is a graph illustrating the relationship between the intersecting width H1 and "bandwidth ratio×Q value" when the IDT electrode 5 is a normal IDT electrode and the intersecting width H1 is about 3λ, about 4λ, about 5λ, and about 7.5λ in the acoustic wave device 1. FIG. 6 also illustrates the plots of "bandwidth ratio×Q value" for comparison when the intersecting width H1 is set to about 10λ and about 15λ. It should be note that "bandwidth ratio×Q value" on the vertical axis in FIG. 6 is the value standardized by the value obtained by the bandwidth ratio × the Q value when the intersecting width H1 is about 7.5λ.

It can be seen from FIG. 6 that, in the acoustic wave device 1, "bandwidth ratio×Q value" is improved (that is, the resonance characteristics are improved) because the intersecting width H1 of the intersecting region 55 is not more than about 7.5λ in the direction in which the plurality of first electrode fingers 53 extend. Although about 3λ, about 4λ, about 5λ, and about 7.5λ are illustrated as the intersecting width H1 in FIG. 6, the lower limit of the intersecting width H1 is, for example, about 2λ.

(5) Advantageous Effects

The acoustic wave device 1 according to the present preferred embodiment includes the supporting substrate 2, the acoustic reflection layer 3, the piezoelectric layer 4, and the IDT electrode 5. The acoustic reflection layer 3 is provided on the supporting substrate 2. The piezoelectric layer 4 is provided on the acoustic reflection layer 3. The IDT electrode 5 is provided on the piezoelectric layer 4. The acoustic reflection layer 3 includes at least one high acoustic impedance layer 31 and at least one low acoustic impedance layer 32. The low acoustic impedance layer 32 has an acoustic impedance lower than that of the high acoustic impedance layer 31. At least one of the at least one high acoustic impedance layer 31 and the at least one low acoustic impedance layer 32 is a conductive layer (the high acoustic impedance layer 31) in the acoustic reflection layer 3. The IDT electrode 5 includes the first busbar 51, the second busbar 52, the plurality of first electrode fingers 53, and the plurality of second electrode fingers 54. The second busbar 52 faces the first busbar 51. The plurality of first electrode fingers 53 are connected to the first busbar 51 and extend toward the second busbar 52. The plurality of second electrode fingers 54 are connected to the second busbar 52 and extend toward the first busbar 51. When a wavelength of an acoustic wave determined by the electrode finger pitch P1 of the IDT electrode 5 is λ and a region between the envelope L1 of tips of the plurality of first electrode fingers 53 and the envelope L2 of tips of the plurality of second electrode fingers 54 is the intersecting region 55, the conductive layer (the high acoustic impedance layer 31) overlaps at least the intersecting region 55 in plan view seen in the thickness direction D1 of the supporting substrate 2 and the distance d1 from the tips of the plurality of first electrode fingers 53 to an end of the conductive layer (the high acoustic impedance layer 31) in a direction in which the plurality of first electrode fingers 53 extend is more than 0 (0λ) and not more than about 12λ. In addition, the distance d2 from the tips of the plurality of second electrode fingers 54 to the end of the conductive layer (the high acoustic impedance layer 31) in the direction in which the plurality of second electrode fingers 54 extend is more than 0 (0λ) and not more than about 12λ.

The acoustic wave device 1 according to the present preferred embodiment can improve the resonance characteristics. In addition, the acoustic wave device 1 according to the present preferred embodiment can reduce ripples caused by unnecessary waves. In addition, the acoustic wave device 1 according to the present preferred embodiment can reduce or prevent reduction in the bandwidth due to an increase in the parasitic capacitance.

In addition, in the acoustic wave device 1 according to the present preferred embodiment, the thickness of the piezoelectric layer 4 is not more than about 1λ, for example, where λ is the wavelength of the acoustic wave determined by the electrode finger pitch P1 of the IDT electrode 5. As a result, the acoustic wave device 1 according to the present preferred embodiment can excite the plate wave.

In addition, in the acoustic wave device 1 according to the present preferred embodiment, the acoustic wave is a plate wave. Accordingly, the acoustic wave device 1 according to the present preferred embodiment can be used as an acoustic wave device that uses a plate wave.

In the acoustic wave device 1 according to the present preferred embodiment, the material for the piezoelectric layer 4 is $LiNbO_3$ or $LiTaO_3$ and the material for the low acoustic impedance layer 32 is $SiO_2$, for example. Here, the elastic constants of $LiNbO_3$ and $LiTaO_3$ have negative temperature characteristics and the elastic constant of $SiO_2$ has positive temperature characteristics. Accordingly, in the acoustic wave device 1 according to the present preferred embodiment, the frequency temperature characteristics can be improved by reducing the absolute value of the temperature coefficient of frequency (TCF).

The preferred embodiment described above is only one of various preferred embodiments of the present invention. The preferred embodiment described above can be modified variously in accordance with the design or the like as long as the purpose and advantageous effects of the present invention can be achieved.

Since the acoustic wave device 1 according to the present preferred embodiment described above includes the acoustic reflection layer 3, the leakage of the acoustic wave can be reduced or prevented, the acoustic wave can be effectively confined, and the Q value can be increased. Since the acoustic reflection layer 3 includes, for example, metal as the material for the high acoustic impedance layer 31, the acoustic impedance ratio between the high acoustic impedance layer 31 and the low acoustic impedance layer 32 can be increased, the plate wave can be effectively reflected, and the Q value of the acoustic wave device 1 can be increased. However, in the structure in which the conductive layer is sized so as to face the entire or substantially the entire IDT electrode 5 in the thickness direction D1 of the supporting substrate 2 as a comparative example of the acoustic wave device 1, the impedance ratio is reduced due to the parasitic capacitance between the IDT electrode 5 and the conductive layer. In contrast, although the resonance characteristics can be improved by meeting both of the first condition and the second condition described below in the acoustic wave device 1 according to the present preferred embodiment, the resonance characteristics can be improved by meeting at least the first condition. The first condition is that the conductive layer (the high acoustic impedance layer 31) overlaps at least the intersecting region 55 in plan view in the thickness direction D1 of the supporting substrate 2 and the distance d1 from the tips of the plurality of first electrode fingers 53 to the end (the end 31A of the high acoustic impedance layer 31) of the conductive layer (the high acoustic impedance layer 31) is more than 0 and not more than about 12λ in the direction in which the plurality of first electrode fingers 53 extend. The second condition is that the distance d2 from the tips of the plurality of second electrode fingers 54 to the end (the end 31B of the high acoustic impedance layer 31) of the conductive layer (the high acoustic impedance layer 31) in the direction in which the plurality of second electrode fingers 54 extend in plan view seen in the thickness direction D1 of the supporting substrate 2 is more than 0 and not more than about 12λ. In the acoustic wave device 1, the acoustic wave can be confined more effectively and the Q value can be made larger in the case in which both of the first condition and the second condition are met than in the case in which only the first condition is met.

In addition, although the conductive layer (the high acoustic impedance layer 31) overlaps both a portion of the first busbar 51 and a portion of the second busbar 52 in plan view seen in the thickness direction D1 of the supporting substrate 2 in the acoustic wave device 1 according to the present preferred embodiment, the conductive layer may overlap at least one of them.

In addition, although the outer peripheral shape of the conductive layer (the high acoustic impedance layer 31) is rectangular or substantially rectangular in plan view in the thickness direction D1 of the supporting substrate 2 in the acoustic wave device 1 according to the present preferred embodiment, this is not necessary and the conductive layer may include a rectangular or substantially rectangular portion and a projecting portion that projects outward on the same plane as the rectangular or substantially rectangular portion from the outer peripheral edge of the rectangular portion. In addition, the conductive layer may be notched.

The acoustic wave device 1 may further include a first wiring layer connected to the first busbar 51, a first terminal connected to the first busbar 51 via the first wiring layer, a second wiring layer connected to the second busbar 52, and a second terminal connected to the second busbar 52 via the second wiring layer. In addition, the acoustic wave device 1 may further include a plurality of third wiring layers connected to the plurality of reflectors 8, respectively. In this case, the plurality of reflectors 8 may be connected to the second terminal via at least the third wiring layer. The first wiring layer extends opposite to the side of the plurality of first electrode fingers 53 from the first busbar 51. The first wiring layer may partially overlap the first busbar 51 in the thickness direction D1 of the supporting substrate 2, or may have the same or substantially the same material and the same or substantially the same thickness as the first busbar 51 and may be integral with the first busbar 51. In addition, the first wiring layer may include a first metal film integral with the first busbar 51 and a metal film provided on the first metal film. The second wiring layer extends opposite to the side of the plurality of second electrode fingers 54 from the second busbar 52. The second wiring layer may partially overlap the second busbar 52 in the thickness direction D1 of the supporting substrate 2, or may have the same or substantially the same material and the same or substantially the same thickness as the second busbar 52 and may be integral with the second busbar 52. In addition, the second wiring layer may include a second metal film integral with the second busbar 52 and a metal film provided on the second metal film.

In addition, although the reflectors 8 are short-circuit gratings in the acoustic wave device 1, the reflectors are not limited to this and may be, for example, open gratings, positive/negative reflection gratings, or the like, for example. In addition, the reflectors 8 are not essential components in the acoustic wave device 1.

In addition, the acoustic wave device 1 may include a plurality of IDT electrodes 5. Here, when the acoustic wave device 1 includes a plurality of pairs of the IDT electrode 5 and the acoustic reflection layer 3, the conductive layers (for example, the high acoustic impedance layers 31) of the plurality of acoustic reflection layers 3 only need to be electrically insulated from each other. When the acoustic wave device 1 includes the plurality of IDT electrodes 5, an acoustic wave filter can be configured by providing an appropriate wiring layer to connect the plurality of IDT electrodes 5 to each other.

Figure 7:
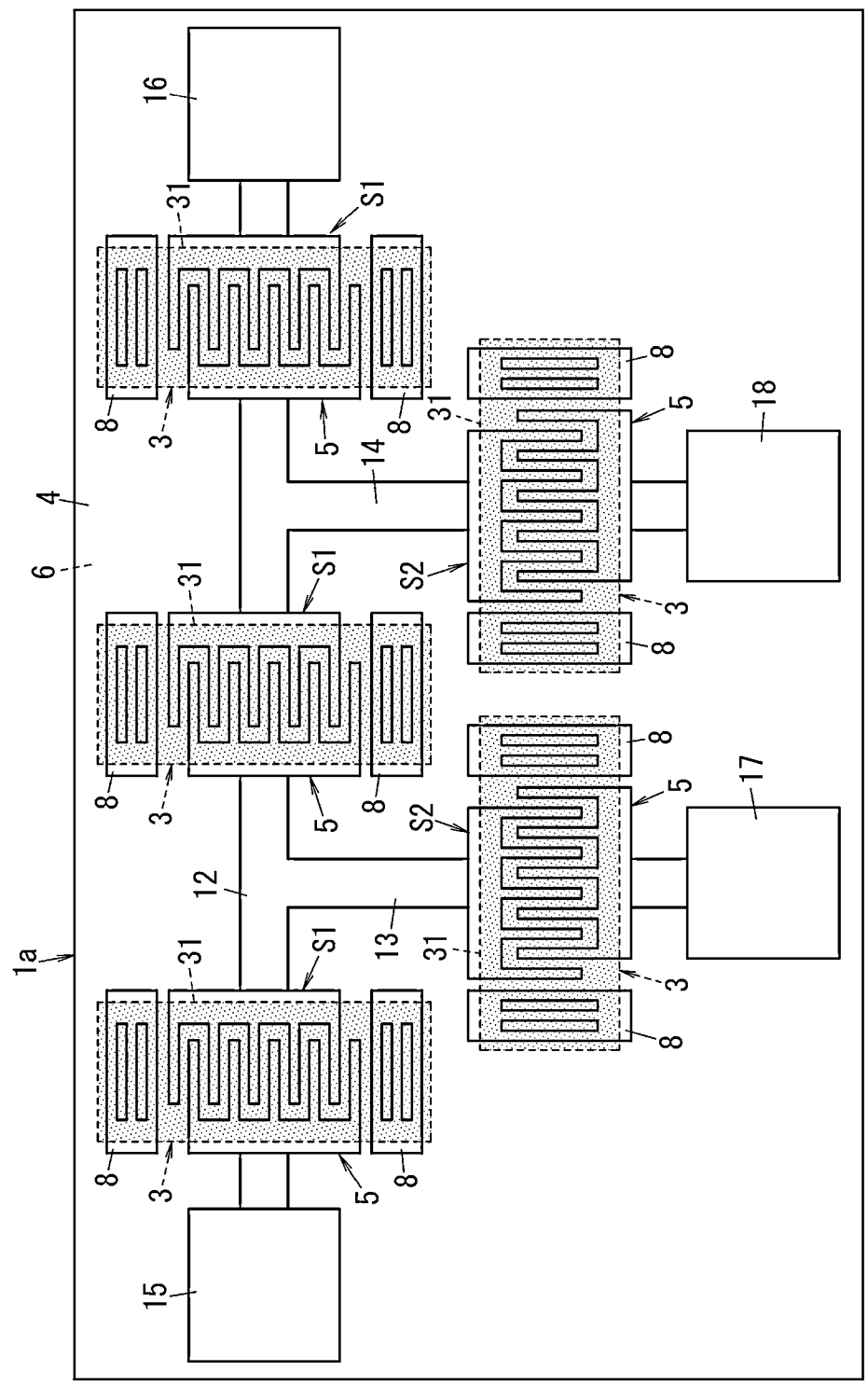
FIG. 7 is a plan view of an acoustic wave device according to a modification of a preferred embodiment of the present invention.
Figure 8:
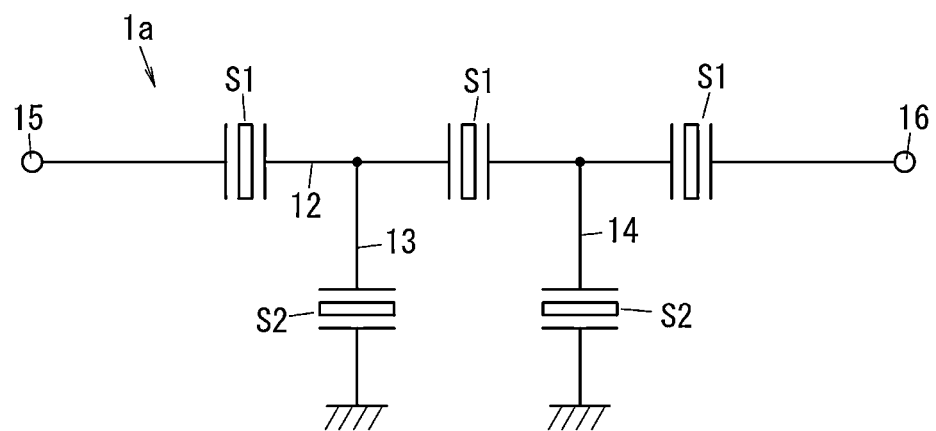
FIG. 8 is an equivalent circuit diagram of the acoustic wave device in FIG. 1.

As illustrated in FIGS. 7 and 8, an acoustic wave device 1*a* according to a modification of the preferred embodiment of the present invention described above is different from the acoustic wave device 1 according to the preferred embodiment described above in that the acoustic wave device 1*a* includes a plurality of (for example, five) IDT electrodes 5 on the piezoelectric layer 4. Regarding the acoustic wave device 1*a*, the same or corresponding components as in the acoustic wave device 1 according to the preferred embodiment described above are denoted by the same reference characters and the description thereof will be omitted.

The acoustic wave device 1*a* is an acoustic wave filter (here, a ladder filter, for example). The acoustic wave device 1*a* includes an input terminal 15, an output terminal 16, a series arm circuit 12 provided on a first path connecting the input terminal 15 and the output terminal 16 to each other, and a plurality of (for example, two) parallel arm circuits 13 and 14 provided on a second path connecting nodes on the first path and grounds (ground terminals 17 and 18). The series arm circuit 12 includes a plurality of (for example, three) series arm resonators S1. Each of the plurality of parallel arm circuits 13 and 14 includes a parallel arm resonator S2. The ground terminals 17 and 18 may be provided as one common ground.

In the acoustic wave device 1a, each of the plurality of series arm resonators S1 and the plurality of parallel arm resonators S2 includes an acoustic wave resonator including the IDT electrode 5, the piezoelectric layer 4, and the acoustic reflection layer 3 described in the preferred embodiment described above. This can improve the resonance characteristics of the acoustic wave device 1a.

The acoustic wave device 1a includes the two parallel arm circuits 13 and 14, but the number of parallel arm circuits is not limited to two and may be, for example, one or not less than three.

An acoustic wave device (1; 1a) according to a preferred embodiment of the present invention includes a supporting substrate (2), an acoustic reflection layer (3), a piezoelectric layer (4), and an IDT electrode (5). The acoustic reflection layer (3) is provided on the supporting substrate (2). The piezoelectric layer (4) is provided on the acoustic reflection layer (3). The IDT electrode (5) is provided on the piezoelectric layer (4). The acoustic reflection layer (3) includes at least one high acoustic impedance layer (31) and at least one low acoustic impedance layer (32). The at least one low acoustic impedance layer (32) has an acoustic impedance lower than that of the at least one high acoustic impedance layer (31). At least one of the at least one high acoustic impedance layer (31) and the at least one low acoustic impedance layer (32) is a conductive layer in the acoustic reflection layer (3). The IDT electrode (5) includes a first busbar (51), a second busbar (52), a plurality of first electrode fingers (53), and a plurality of second electrode fingers (54). The second busbar (52) faces the first busbar (51). The plurality of first electrode fingers (53) are connected to the first busbar (51) and extend toward the second busbar (52). The plurality of second electrode fingers (54) are connected to the second busbar (52) and extend toward the first busbar (51). When a wavelength of an acoustic wave determined by an electrode finger pitch (P1) of the IDT electrode (5) is λ and a region between an envelope (L1) of tips of the plurality of first electrode fingers (53) and an envelope (L2) of tips of the plurality of second electrode fingers (54) is an intersecting region (55), the conductive layer overlaps at least the intersecting region (55) in plan view in a thickness direction of the piezoelectric layer (4) and a distance (d1) from the tips of the plurality of first electrode fingers (53) to an end (the end 31A of the high acoustic impedance layer 31) of the conductive layer (the high acoustic impedance layer 31) in a direction in which the plurality of first electrode fingers (53) extend is more than 0 and not more than about 12λ.

The acoustic wave device (1; 1a) according to the preferred embodiment described above can improve the resonance characteristics.

In an acoustic wave device (1; 1a) according to a preferred embodiment of the present invention, a distance (d2) from the tips of the plurality of second electrode fingers (54) to an end (the end 31B of the high acoustic impedance layer 31) of the conductive layer (the high acoustic impedance layer 31) is more than 0 and not more than about 12λ in a direction in which the plurality of second electrode fingers (54) extend in plan view in the thickness direction (D1) of the supporting substrate (2).

The acoustic wave device (1; 1a) according to the preferred embodiments described above can improve the Q value.

In an acoustic wave device (1; 1a) according to a preferred embodiment of the present invention, the conductive layer (the high acoustic impedance layer 31) overlaps at least one of a portion of the first busbar (51) and a portion of the second busbar (52) in plan view in the thickness direction (D1) of the supporting substrate (2).

In an acoustic wave device (1; 1a) according to a preferred embodiment of the present invention, an intersecting width (H1) of the intersecting region (55) in the direction in which the plurality of first electrode fingers (53) extend is not more than about 7.5λ.

The acoustic wave device (1; 1a) according to the preferred embodiments described above can improve the resonance characteristics.

In an acoustic wave device (1; 1a) according to a preferred embodiments of the present invention, the at least one high acoustic impedance layer (31) includes a plurality of high acoustic impedance layers. The at least one low acoustic impedance layer (32) includes a plurality of low acoustic impedance layers. The plurality of high acoustic impedance layers (31) and the plurality of low acoustic impedance layers (32) are provided alternately one by one in the thickness direction (D1) of the supporting substrate (2).

In an acoustic wave device (1; 1a) according to a preferred embodiment of the present invention, a thickness of the piezoelectric layer (4) is not more than about 1λ.

In an acoustic wave device (1; 1a) according to a preferred embodiment described above, a plate wave can be excited.

In an acoustic wave device (1; 1a) according to a preferred embodiment of the present invention, the acoustic wave is a plate wave.

An acoustic wave device (1; 1a) according to a preferred embodiment described above can be used as an acoustic wave device that uses a plate wave.

In an acoustic wave device (1a) according to a preferred embodiment of the present invention, the acoustic wave device (1a) is an acoustic wave filter including a plurality of acoustic wave resonators. Each of the plurality of acoustic wave resonators is a resonator including the IDT electrode (5), the piezoelectric layer (4), and the acoustic reflection layer (3). Piezoelectric layers (4), each of which is the piezoelectric layer (4) provided on the acoustic reflection layer (3), of the plurality of acoustic wave resonators are connected to each other. Acoustic reflection layers (3), each of which is the acoustic reflection layer (3) provided on the supporting substrate (2), of the plurality of acoustic wave resonators are separated from each other and electrically insulated from each other.

An acoustic wave device (1a) according to a preferred embodiment described above can improve the resonance characteristics of the acoustic wave filter.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a supporting substrate;
   an acoustic reflection layer on the supporting substrate;
   a piezoelectric layer on the acoustic reflection layer; and
   an IDT electrode on the piezoelectric layer; wherein
   the acoustic reflection layer includes:
      at least one high acoustic impedance layer; and at least one low acoustic impedance layer with an acoustic impedance lower than an acoustic impedance of the at least one high acoustic impedance layer;

at least one of the at least one high acoustic impedance layer and the at least one low acoustic impedance layer is a conductive layer in the acoustic reflection layer;

the IDT electrode includes:
- a first busbar;
- a second busbar facing the first busbar;
- a plurality of first electrode fingers connected to the first busbar and extending toward the second busbar; and
- a plurality of second electrode fingers connected to the second busbar and extending toward the first busbar; and when a wavelength of an acoustic wave determined by an electrode finger pitch of the IDT electrode is λ and a region between an envelope of tips of the plurality of first electrode fingers and an envelope of tips of the plurality of second electrode fingers is an intersecting region, the conductive layer overlaps at least the intersecting region in plan view in a thickness direction of the supporting substrate, and a distance from the tips of the plurality of first electrode fingers to an end of the conductive layer in a direction in which the plurality of first electrode fingers extend is more than 0 and not more than about 12λ.

2. The acoustic wave device according to claim 1, wherein a distance from the tips of the plurality of second electrode fingers to an end of the conductive layer is more than 0 and not more than about 12λ in a direction in which the plurality of second electrode fingers extend in the plan view in the thickness direction of the supporting substrate.

3. The acoustic wave device according to claim 1, wherein the conductive layer overlaps at least one of a portion of the first busbar and a portion of the second busbar in the plan view in the thickness direction of the supporting substrate.

4. The acoustic wave device according to claim 1, wherein an intersecting width of the intersecting region in the direction in which the plurality of first electrode fingers extend is not more than about 7.5λ.

5. The acoustic wave device according to claim 1, wherein
- the at least one high acoustic impedance layer includes a plurality of high acoustic impedance layers;
- the at least one low acoustic impedance layer includes a plurality of low acoustic impedance layers; and
- the plurality of high acoustic impedance layers and the plurality of low acoustic impedance layers are provided alternately one by one in the thickness direction of the supporting substrate.

6. The acoustic wave device according to claim 1, wherein a thickness of the piezoelectric layer is not more than about 1λ.

7. The acoustic wave device according to claim 6, wherein the acoustic wave is a plate wave.

8. The acoustic wave device according to claim 1, wherein
- the acoustic wave device is an acoustic wave filter including a plurality of acoustic wave resonators;
- each of the plurality of acoustic wave resonators is a resonator including the IDT electrode, the piezoelectric layer, and the acoustic reflection layer;
- piezoelectric layers, each of which is the piezoelectric layer on the acoustic reflection layer, of the plurality of acoustic wave resonators are connected to each other; and
- acoustic reflection layers, each of which is the acoustic reflection layer on the supporting substrate, of the plurality of acoustic wave resonators are separated from each other and electrically insulated from each other.

9. The acoustic wave device according to claim 1, wherein the supporting substrate has a rectangular or substantially rectangular shape.

10. The acoustic wave device according to claim 1, wherein the supporting substrate is a silicon substrate.

11. The acoustic wave device according to claim 1, wherein the at least one high acoustic impedance layer include Pt.

12. The acoustic wave device according to claim 1, wherein the at least one low acoustic impedance layer includes $SiO_2$.

13. The acoustic wave device according to claim 1, wherein a thickness of each of the at least one high acoustic impedance layer is about 0.09λ.

14. The acoustic wave device according to claim 1, wherein a thickness of each of the at least one low acoustic impedance layer is about 0.14λ.

15. The acoustic wave device according to claim 1, further comprising an electrical insulating layer surrounding the acoustic reflection layer in the plan view in the thickness direction of the supporting substrate.

16. The acoustic wave device according to claim 15, wherein the electrical insulating layer is interposed between the supporting substrate and the piezoelectric layer at a position different from a position of the acoustic reflection layer.

17. The acoustic wave device according to claim 15, wherein the electrical insulating layer is made of a same material as the at least one low acoustic impedance layer.

18. The acoustic wave device according to claim 1, wherein the piezoelectric layer includes X-cut 40° propagation $LiNbO_3$ with Euler angles of about 90°, about 90°, about 40°.

19. The acoustic wave device according to claim 1, wherein a thickness of the piezoelectric layer is about 0.2λ.

* * * * *